(12) United States Patent  
Ali et al.

(10) Patent No.: US 8,035,436 B2  
(45) Date of Patent: Oct. 11, 2011

(54) PASSIVE CAPACITIVELY INJECTED PHASE INTERPOLATOR

(75) Inventors: Tamer M. Ali, Los Angeles, CA (US); Robert J. Drost, Los Altos, CA (US); Chih-Kong Ken Yang, Pacific Palisades, CA (US)

(73) Assignee: Oracle America, Inc., Redwood Shores, CA (US)

( * ) Notice: Subject to any disclaimer, the term of this patent is extended or adjusted under 35 U.S.C. 154(b) by 78 days.

(21) Appl. No.: 12/566,506

(22) Filed: Sep. 24, 2009

(65) Prior Publication Data

US 2011/0068827 A1 Mar. 24, 2011

(51) Int. Cl.
*H03H 11/16* (2006.01)
(52) U.S. Cl. .......................... 327/231; 327/237; 327/355
(58) Field of Classification Search .................. None
See application file for complete search history.

(56) References Cited

U.S. PATENT DOCUMENTS

| | | | | |
|---|---|---|---|---|
| 5,341,050 A | * | 8/1994 | Mellissinos et al. | 327/355 |
| 5,465,064 A | * | 11/1995 | Shou et al. | 327/361 |
| 6,107,871 A | * | 8/2000 | Shin | 327/554 |
| 6,133,773 A | * | 10/2000 | Garlepp et al. | 327/247 |
| 6,696,876 B2 | * | 2/2004 | Drost et al. | 327/298 |
| 2010/0079180 A1 | * | 4/2010 | Kim et al. | 327/158 |

* cited by examiner

*Primary Examiner* — An Luu
(74) *Attorney, Agent, or Firm* — Park, Vaughan, Fleming & Dowler LLP; Steven E. Stupp

(57) ABSTRACT

A phase-interpolator circuit is described. In the phase-interpolator circuit, an output signal, having a fundamental frequency and a phase, is generated based on a weighted summation of a first reference signal and a second reference signal, where the first reference signal has the fundamental frequency and a first phase, and the second reference signal has the same fundamental frequency and a second phase. Note that contributions of the first reference signal and the second reference signal, respectively, to the output signal are determined based on associated first and second impedance values in a weighting circuit in the phase-interpolator circuit. For example, a programmable capacitance ratio of two capacitors may be used to interpolate between the first reference signal and the second reference signal. Additionally, the phase-interpolator circuit may include a biasing circuit that provides a DC bias to the weighting circuit, and which amplifies the output of the weighting circuit to provide the output signal.

20 Claims, 11 Drawing Sheets

PASSIVE CAPACITIVELY INJECTED PHASE INTERPOLATOR

BACKGROUND

1. Field

The present disclosure generally relates to a phase-interpolator circuit. More specifically, the present disclosure relates to a phase-interpolator circuit in which the output phase is specified using a capacitor divider.

2. Related Art

Phase-interpolator circuits (which are sometimes referred to as 'phase interpolators') are important building blocks in modern high-speed clocking systems and serial-link transceivers. Given at least two quadrature clock signals, phase-interpolator circuits can generate output phases over a 360° range. As a consequence, most delay-locked-loops and timing-recovery circuits in high-speed input/output circuits and serial links use phase-interpolator circuits to provide arbitrary clock phases.

Many existing phase-interpolator circuits use active devices to sum the weighted voltages or currents associated with the input clock phases. However, these phase-interpolator circuits have associated nonlinearities, which can limit performance and typically require an increase in the resolution in order to minimize the phase steps in the phase-interpolator circuits, i.e., the differential nonlinearity (DNL). Furthermore, the increased resolution often results in more complicated circuits that occupy more area.

The origins of the nonlinearities in existing phase-interpolator circuits are illustrated in FIGS. 1A-1C. FIG. 1A presents a block diagram illustrating an existing phase-interpolator circuit 100. In this phase-interpolator circuit, a voltage interpolator adds the weighted sum of the input clock-signal voltages, where the weighting of a given clock signal is defined by the strength of an associated clock buffer.

FIG. 1B presents a block diagram illustrating an existing phase-interpolator circuit 130. This phase-interpolator circuit is a variation on phase-interpolator circuit 100 (FIG. 1A). In particular, currents proportional to input clock signals are added together to perform the interpolation (phase-interpolator circuit 130 is sometimes referred to as a type I current interpolator). Note that the interpolation weight is defined by the ratio of currents in the two differential pairs, which can be defined using analog or digital control of the current. Also note that phase-interpolator circuit 130 benefits from the common-mode noise rejection provided by the differential pair.

However, phase-interpolator circuit 130 has a high capacitance, and a nonlinear output impedance. In particular, the weight-change technique is nonlinear because the finite output impedance of the current source causes the current to change nonlinearly even when device dimensions are changed linearly. For example, if the size of the current source is doubled for the same gate voltage, presumably the current will be doubled. But the increase in the current in the differential pair M1 and M2 causes their common-source voltage to drop. This drop is equivalent to a drop in the drain-source voltage of the current source. Therefore, because of the finite output impedance of the current source, the drop in the drain-source voltage results in a current increase that is less than a factor of two.

In addition, nonlinearity associated with interpolation may occur due to capacitive feed-through of a clock signal through the gate-drain capacitance. This feed-through provides an alternative path for the clock signal other than the desired interpolation path. In order to explain this effect, assume that phase-interpolator circuit 130 is programmed to allow clock phase CLKin1 to drive the output, i.e., the contribution associated with clock phase CLKin2 is switched off. Even though phase-interpolator current will be steered to differential pair M1-M2, CLKin2 is fed through to the output by the gate-to-drain capacitance of M3-M4. Moreover, this problem is worse in high-frequency applications where the gate-drain capacitance provides a lower impedance path.

FIG. 1C presents a block diagram illustrating an existing phase-interpolator circuit 160. This phase-interpolator circuit differs from phase-interpolator circuit 130 (FIG. 1B) because phase-interpolator circuit 160 includes additional control switches M5-M8 which isolate the output from the input clock signals (phase-interpolator circuit 160 is sometimes referred to as a type II current interpolator). Note that phase-interpolator circuit 160 alleviates both of the preceding non-linearities by cascoding transistors M5-M8, and by using a separate differential pair for every phase step. In phase-interpolator circuit 160, changing the interpolation weight now requires changing the weights of all N differential pairs as well (i.e., keeping all N ratios constant, but also driving N differential pairs). However, relative to other existing phase-interpolator circuits, phase-interpolator circuit 160: occupies more area, consumes more power, presents more loading to previous stages, and requires more voltage headroom (i.e., has a smaller output swing). Additionally, splitting up the differential pairs in phase-interpolator circuit 130 (FIG. 1B) into the N separate differential pairs in phase-interpolator-circuit 160 reduces the size of each differential pair, which, in turn, increases the transistor mismatch. This increased transistor mismatch increases the variation in the size of the phase steps in phase-interpolator circuit 160 (FIG. 1C).

Similarly, in phase-interpolator circuit 100 (FIG. 1A), a number of tri-state buffers equal to the number of phase steps are typically used to reduce clock feed-through, and to achieve acceptable linearity performance. However, this configuration also: occupies more layout area, consumes more power, presents more loading to the previous stages, increases the transistor mismatch, and phase-step-size variation.

Hence, what is needed is a phase-interpolator circuit without the above-described problems.

SUMMARY

One embodiment of the present disclosure provides a phase-interpolator circuit. This phase-interpolator circuit includes a first input node that receives a first reference signal, and a second input node that receives a second reference signal. Note that the first reference signal has a fundamental frequency and a first phase, and the second reference signal has the same fundamental frequency and a second phase. Furthermore, the phase-interpolator circuit includes a weighting circuit with an output, and inputs that are electrically coupled to the first input node and the second input node. Contributions of the first reference signal and the second reference signal, respectively, to the output are provided by the weighting circuit based on associated first and second impedance values. Additionally, the phase-interpolator circuit includes a biasing circuit that provides a DC bias to the weighting circuit, and which amplifies the output of the weighting circuit to provide an output of the phase-interpolator circuit.

In some embodiments, the weighting circuit includes a voltage divider that has a first arm electrically coupled to the first input node and a central node in the voltage divider, and that has a second arm electrically coupled to the second input node and the central node. Note that the central node is electrically coupled to the biasing circuit. Furthermore, the first arm may include a first component that has the first impedance value, and the second arm may include a second component that has the second impedance value. For example, the first component may include a first capacitor, and the first impedance value may be a first capacitance of the first capacitor. Similarly, the second component may include a second capacitor, and the second impedance value may be a second capacitance of the second capacitor.

In some embodiments, a given capacitance, which can be the first capacitance or the second capacitance, is selectable. For example, the given capacitor may include a switched capacitance network. Alternatively, the given capacitance may be adjustable.

In some embodiments, capacitances of one or more capacitors in the switched capacitor network include small differences relative to capacitances of other capacitors in the switch capacitor network that compensate for nonlinearities in the output of the phase-interpolator circuit.

Note that a series summation of the first impedance value and the second impedance value may be approximately constant. For example, a series summation of the first capacitance and the second capacitance may be approximately constant.

Furthermore, the output of the weighting circuit may have approximately a constant amplitude for different relative contributions of the first reference signal and the second reference signal. Additionally, the output of the phase-interpolator circuit may have a constant amplitude for a range of phase values.

In some embodiments, the phase-interpolator circuit is disposed on an integrated circuit. This integrated circuit may include: a processor, a communication circuit and/or a clock generator.

Another embodiment provides an electronic device that includes the integrated circuit.

Another embodiment provides a method for generating a signal having a fundamental frequency and a phase using the phase-interpolator circuit. During operation, the phase-interpolator circuit receives the first reference signal on the first input node, and receives the second reference signal on the second input node. Then, the phase-interpolator circuit modifies the first impedance value and the second impedance value in the weighting circuit, thereby determining associated relative contributions of the first reference signal and the second reference signal to the output of the weighting circuit. Moreover, the biasing circuit provides the DC bias to the weighting circuit. Next, the biasing circuit amplifies the output of the weighting circuit to provide the signal.

In some embodiments, the first impedance value is a first capacitance associated with a first capacitor in the weighting circuit, and the second impedance value is a second capacitance associated with a second capacitor in the weighting circuit. Furthermore, modifying the first impedance value and the second impedance value may involve, respectively, adjusting the first capacitance and the second capacitance. Alternatively, modifying the first impedance value and the second impedance value may involve, respectively, selecting the first capacitance and the second capacitance.

BRIEF DESCRIPTION OF THE FIGURES

The patent or application file contains at least one drawing executed in color. Copies of this patent or patent application publication with color drawing(s) will be provided by the Office upon request and payment of the necessary fee.

Figure 3:
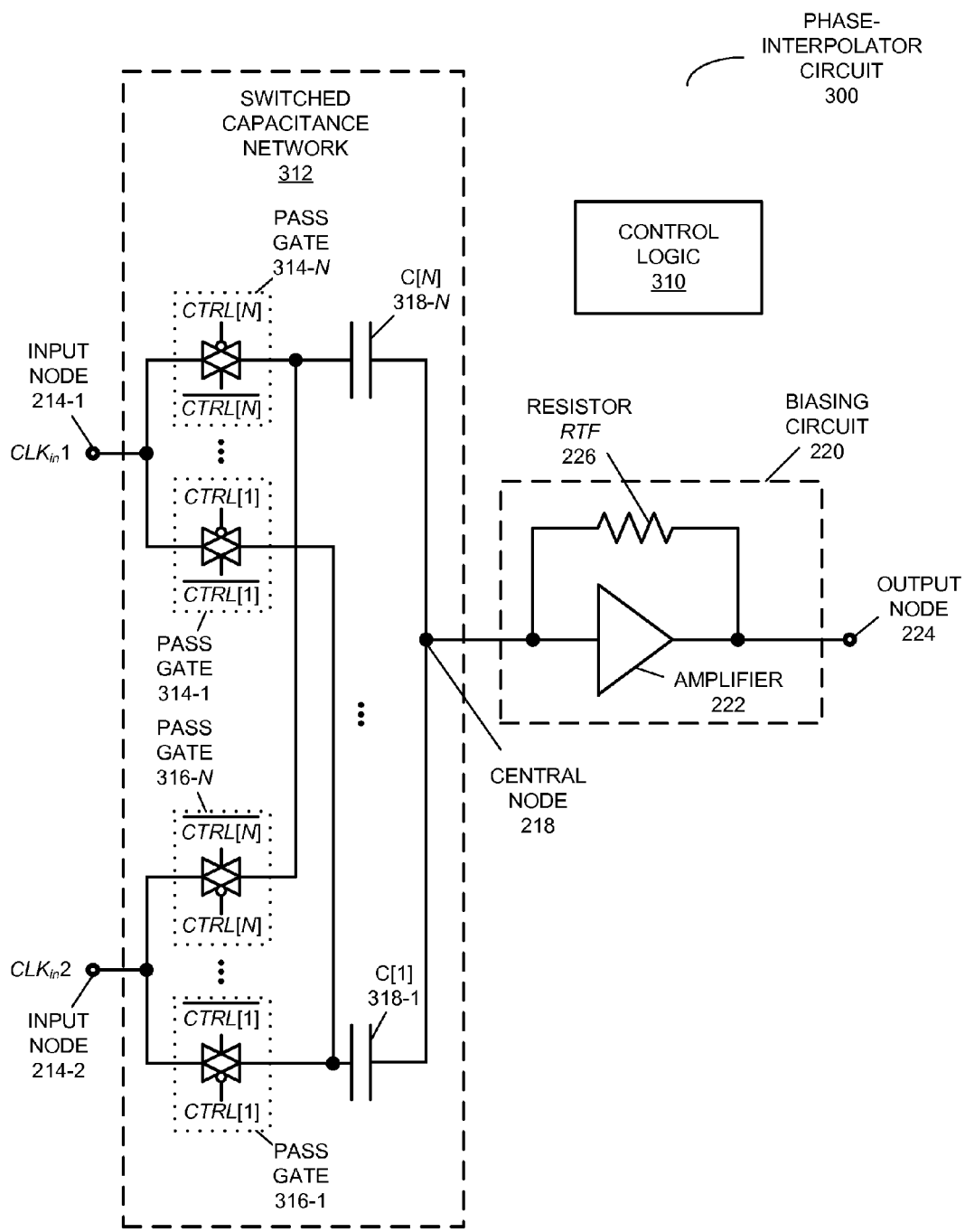
FIG. 3 is a block diagram illustrating a phase-interpolator circuit in accordance with an embodiment of the present disclosure.

Table 1 provides a comparison of the linearity of the phase-interpolator circuit of FIG. 3 and an existing phase-interpolator circuit in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a phase-interpolator circuit, an integrated circuit that includes the phase-interpolator circuit, an electronic device that includes the integrated circuit, and a method for generating a signal using the phase-interpolator circuit are described. In the phase-interpolator circuit, an output signal, having a fundamental frequency and a phase, is generated based on a weighted summation of a first reference signal and a second reference signal, where the first reference signal has the fundamental frequency and a first phase, and the second reference signal has the same fundamental frequency and a second phase. Note that contributions of the first reference signal and the second reference signal, respectively, to the output signal are determined based on associated first and second impedance values in a weighting circuit in the phase-interpolator circuit. For example, a programmable capacitance ratio of two capacitors may be used to interpolate between the first reference signal and the second reference signal. Additionally, the phase-interpolator circuit may include a biasing circuit that provides a DC bias to the weighting circuit, and which amplifies the output of the weighting circuit to provide the output signal.

By combining the first reference signal and the second reference signal based on the first and second impedance values, the phase-interpolator circuit reduces the nonlinearity and capacitance of the phase-interpolator circuit, as well as the layout area and the loading of previous stages. Consequently, the phase-interpolator circuit may also have reduced: complexity, power consumption and cost relative to existing phase-interpolator circuits.

Figure 1A:
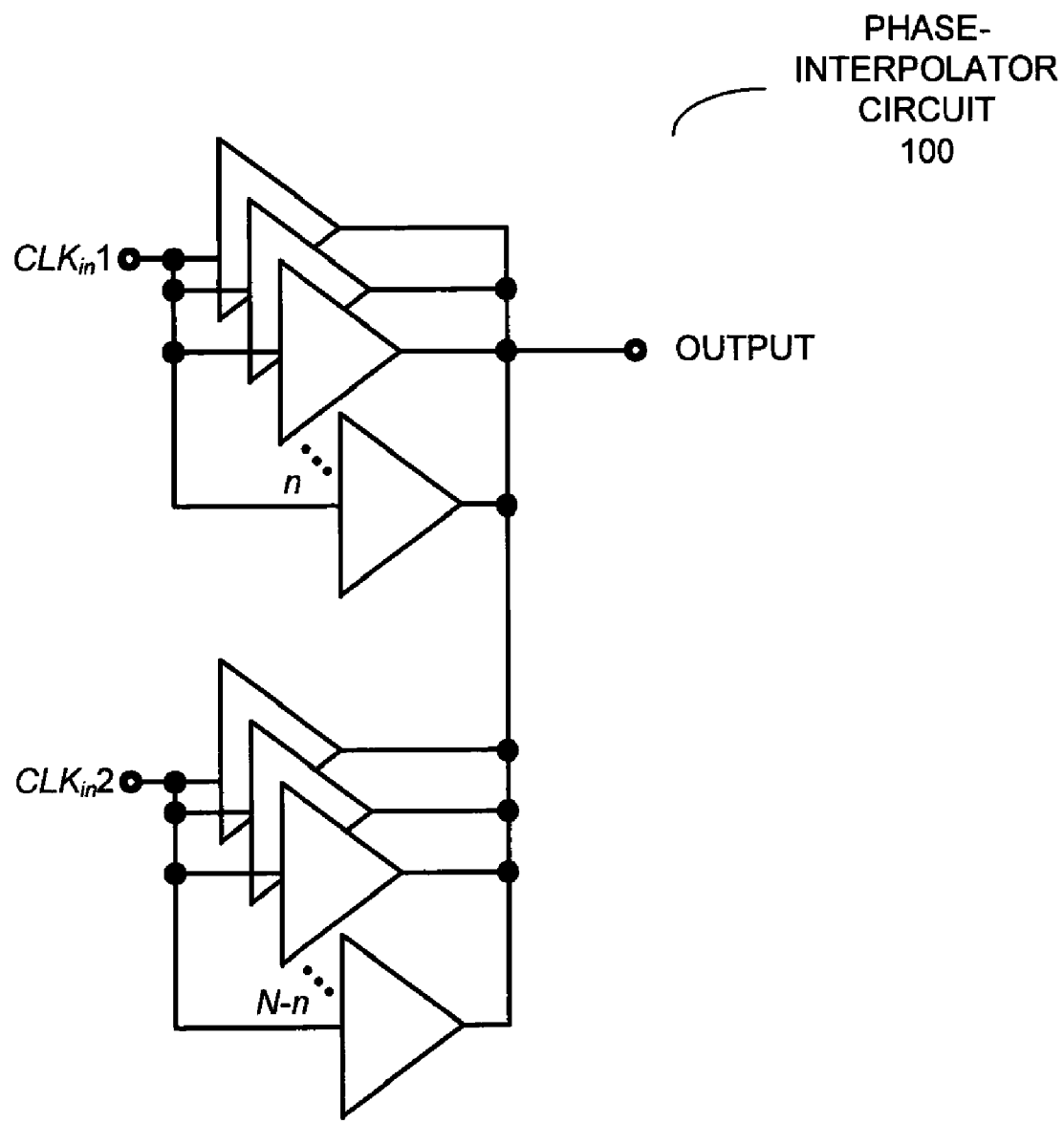
FIG. 1A is a block diagram illustrating an existing phase-interpolator circuit.
Figure 1B:
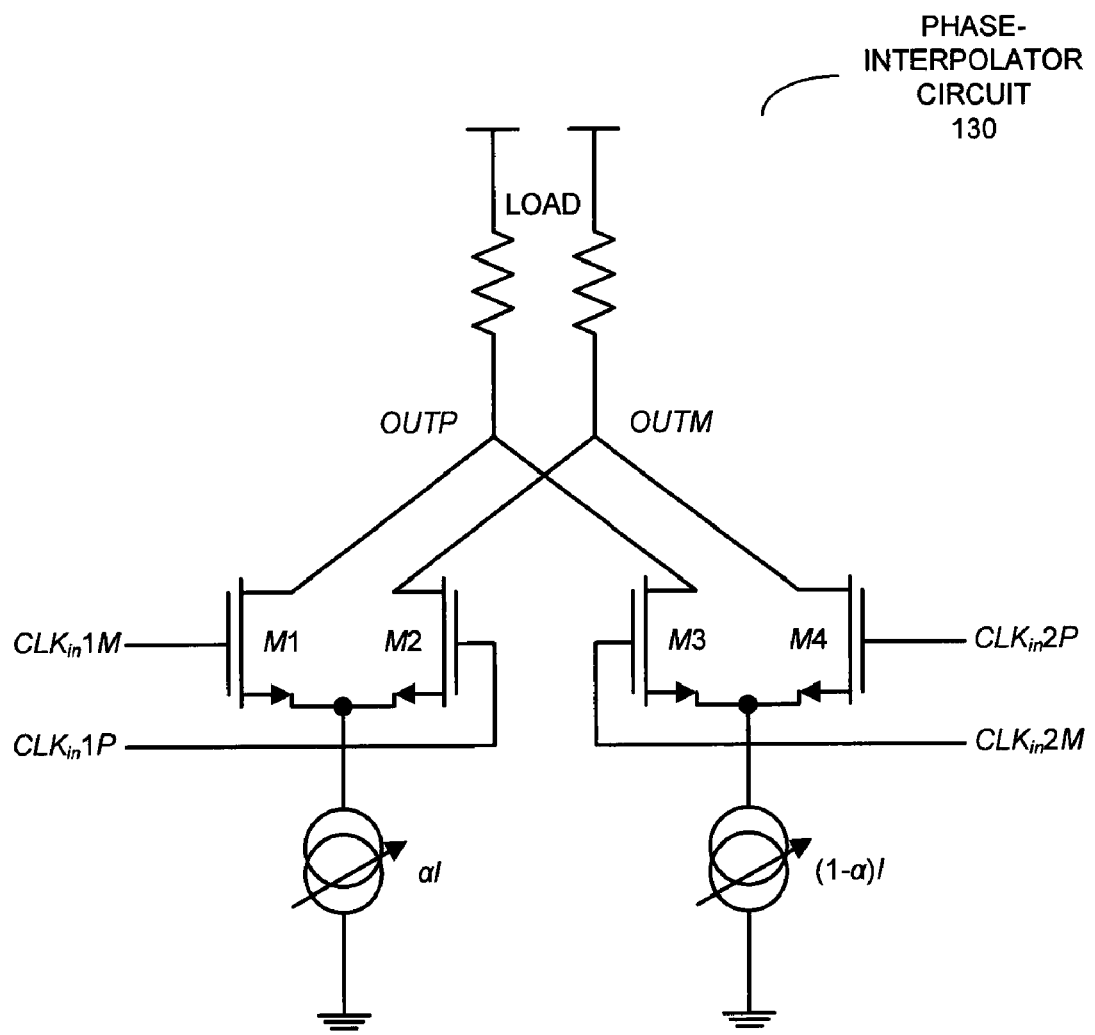
FIG. 1B is a block diagram illustrating an existing phase-interpolator circuit.
Figure 1C:
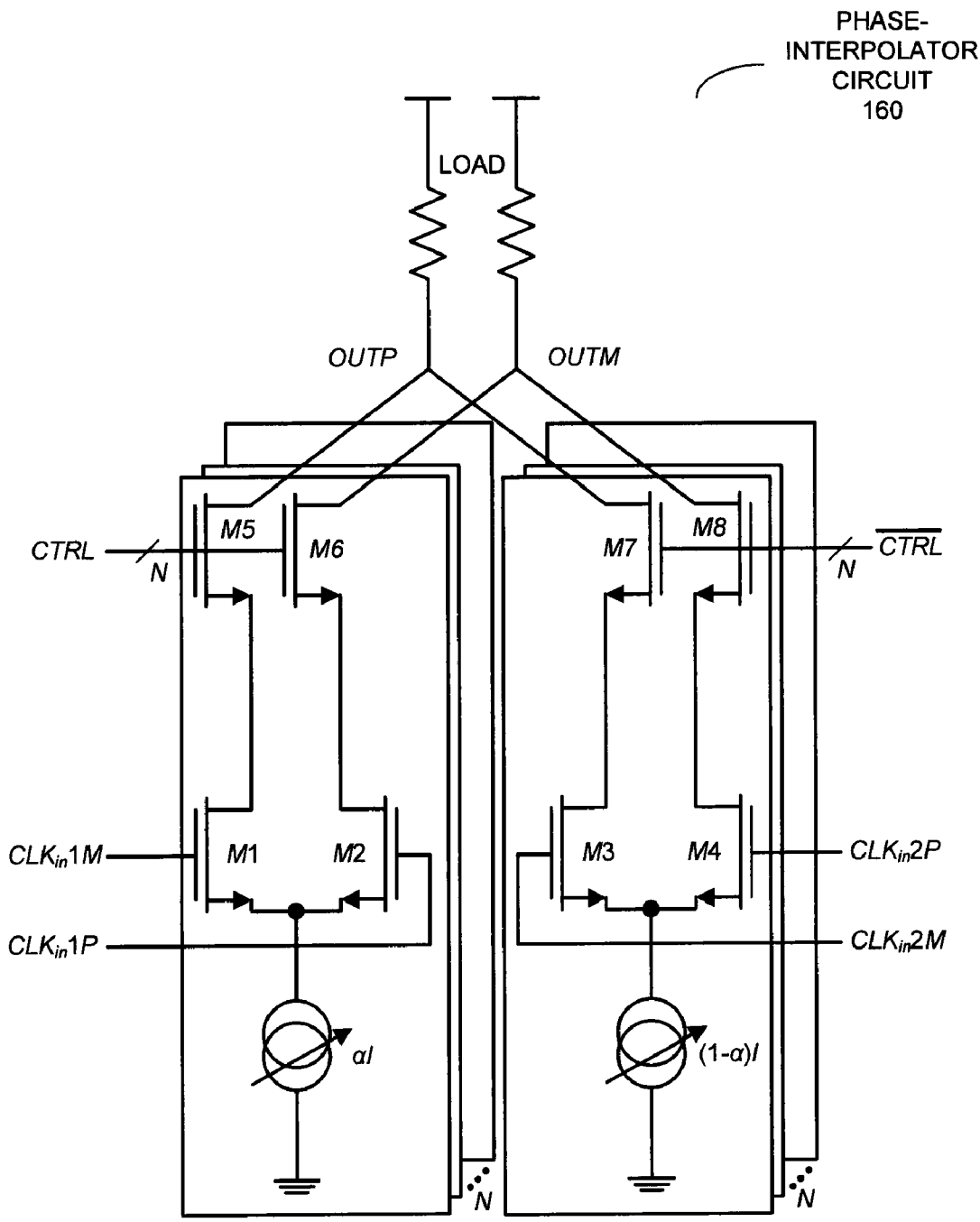
FIG. 1C is a block diagram illustrating an existing phase-interpolator circuit.
Figure 2:
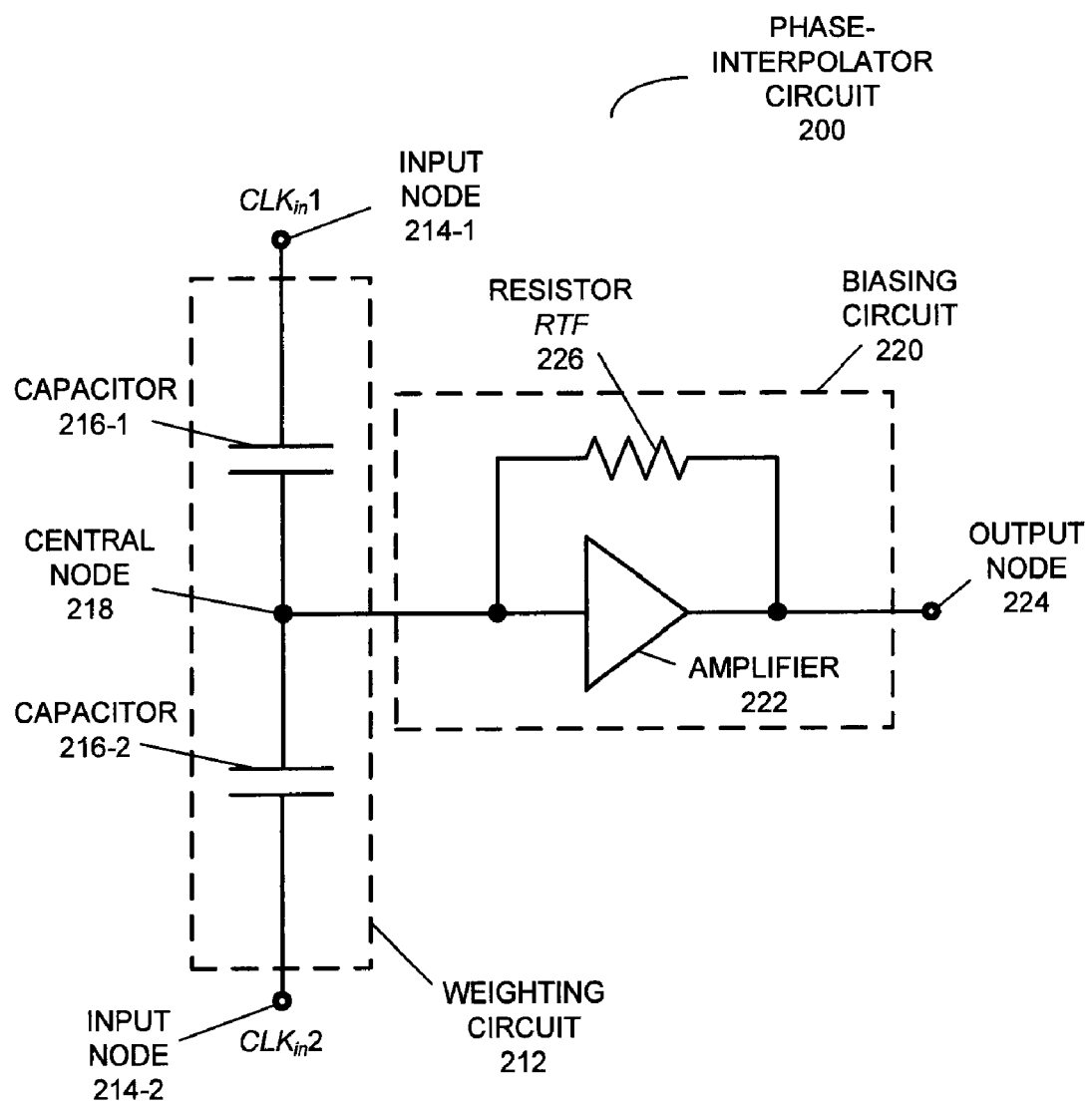
FIG. 2 is a block diagram illustrating a phase-interpolator circuit in accordance with an embodiment of the present disclosure.

We now describe embodiments of the phase-interpolator circuit. FIG. 2 presents a block diagram illustrating a phase-interpolator circuit 200. In this phase-interpolator circuit, reference signals are input into weighting circuit 212 at input nodes 214. For example, the references signals may be clock signals, which each have a fundamental frequency and associated clock phases $CLK_{in}1$ and $CLK_{in}2$.

Contributions of these clock signals to an output signal from phase-interpolator circuit 200 (i.e., the interpolation of the clock signals) may be based on impedances, having impedance values, in arms of a voltage divider in weighting circuit 212. In particular, the impedances may be capacitors 216, and the impedance values may be associated capacitances $C_1$ and $C_2$. Therefore, the two clock phases sum at central node 218 of capacitors 216 according to the weighted sum of $C_1$ and $C_2$. Then, amplifier 222 in biasing circuit 220 amplifies the interpolated signal to the desired swing on output node 224. Furthermore, feedback resistor RTF 226 sets the DC common mode for central node 218. This operation restores the DC input that was blocked by capacitors 216 (i.e., it provides DC bias), and defines the input common mode at the summing node (i.e., central node 218) of amplifier 222 to be the same as the output common mode.

Capacitors 216 may be passive, linear components. Consequently, if clock phases $CLK_{in}1$ and $CLK_{in}2$ are reasonably spaced (for example, by one eighth to one quarter of a cycle), the linearity of phase-interpolator circuit 200 may be limited by the linearity of capacitors 216 (which is theoretically infinite). Furthermore, the use of capacitive summation also minimizes clock-signal leakage to output node 224. Additionally, when the impedances are capacitors, viewed from input nodes 214 phase-interpolator circuit 200 behaves like a high-pass filter, which has good high-frequency performance.

In some embodiments, a given capacitance, which can be the capacitance of capacitor 216-1 or the capacitance of capacitor 216-2, is selectable based on a programmable setting. This is shown in FIG. 3, which presents a block diagram illustrating a phase-interpolator circuit 300. During operation, digital control signals CTRL[i] corresponding to the programmable setting may be provided by control logic 310, and the given capacitor may include a switched capacitance network 312. Note that switched capacitance network 312 includes pass gates 314 and 316, each one of which is coupled to one of the clock signals on input nodes 214 and one of capacitors C[i] 318 in banks of parallel capacitors in switched capacitance network 312. Furthermore, the control signals CTRL[i] may select a desired capacitance value by opening and/or closing pass gates 314 and 316 so that, at a given time, only one clock signal is coupled to the given capacitor. In this way, capacitors 318 are fully utilized and shared between the input clock signals, and the interpolation takes place at central node 218 (i.e., the common terminal of capacitors 318) as a weighted sum of the input clock signals.

Phase-interpolator circuit 300 may alleviate or eliminate many of the problems with existing phase-interpolator circuits. In particular, because the weighting of the interpolation ratio uses digitally switched passive components, it is inherently linear. Furthermore, there is no alternative capacitive path from input nodes 214 to output node 224. Instead, the only path available is the capacitive-interpolating path provided by the bank of capacitors 318 in switched capacitance network 312.

In addition, from the perspective of input loading, each clock signal is loaded with the series combination of the net capacitive load (as shown in FIG. 2), i.e., $$Cload = \frac{C_1 \cdot C_2}{C_1 + C_2}.$$

This load has a maximum value when $C_1$ and $C_2$ are equal, and this results in half of the total capacitance as the net capacitive load for the two input clock signals. In comparison with existing phase-interpolation circuits, the net load seen by the input clock signals is equal to the total number of devices that load input nodes 214. Furthermore, the capacitive interpolation has reduced worst-case load, and uses even less power as the weighting of clock phases $CLK_{in}1$ or $CLK_{in}2$ is selected to dominate the interpolation. Note that the variable load may impact the design of the previous stage, because it could slightly affect the input clock-signal delay and phase. In some embodiments, dummy capacitors may be switched in or out as the interpolation weight associated with a given clock signal is changed, thereby reducing or eliminating load variations.

In order to function as a phase interpolator, a normalization criterion or constraint may be imposed on the impedance values. For example, a series summation of the impedance values, such as capacitor 216-1 (FIG. 2) and capacitor 216-2 (FIG. 2), may be approximately constant, which may result in an approximately constant amplitude for the output of weighting circuit 212 (FIG. 2) (such as switched capacitance network 312) at central node 218 for different relative contributions of the clock signals. In addition, the output of phase-interpolator circuits 200 (FIG. 2) and 300 may have a constant amplitude for a range of phase values.

However, the absolute values of the capacitances of capacitors 216 (FIG. 2) may not affect the interpolation operation. In principle, these capacitors can be as small as matching permits, or big enough so that the net swing of the interpolated signal is not adversely affected by the voltage division with the parasitic capacitance at central node 218. In an exemplary embodiment, 5-bit resolution can be implemented using 32 capacitors 318. Moreover, each of capacitors 318 may be a metal capacitor having a capacitance of a few femto Farads (such as 4 fF).

Figure 4:
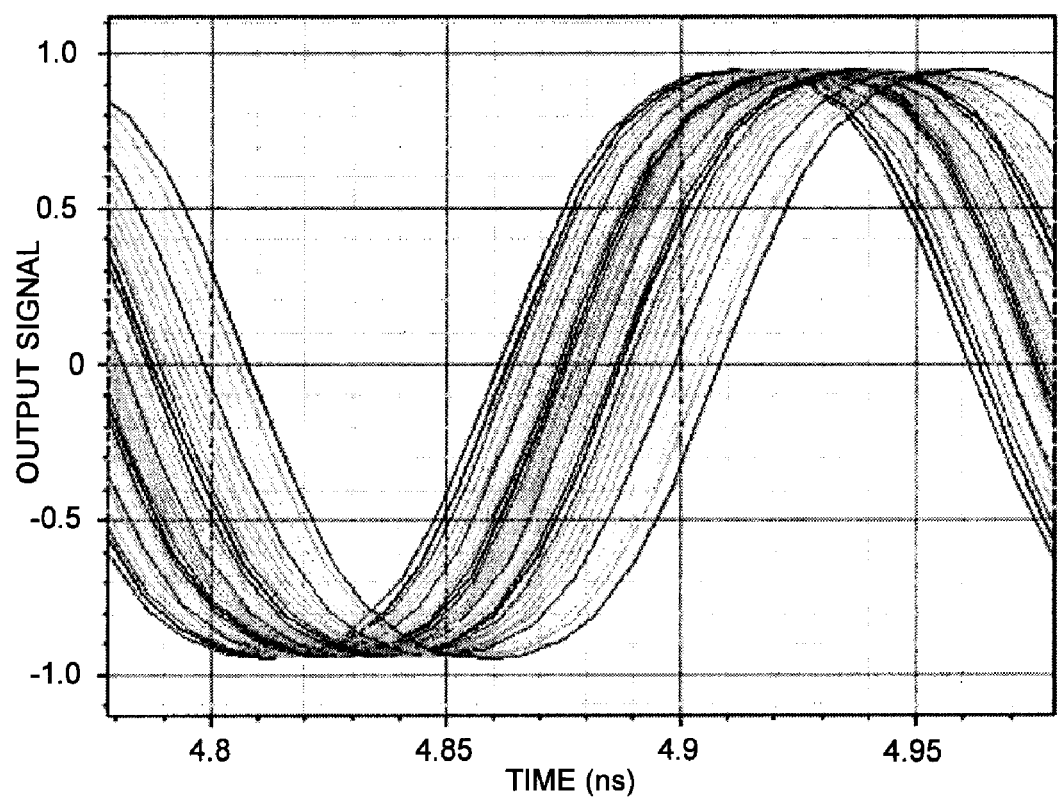
FIG. 4 is a graph of simulated outputs from the phase-interpolator circuit of FIG. 3 in accordance with an embodiment of the present disclosure.

We now present simulation results. FIG. 4 presents a graph of simulated outputs from phase-interpolator circuit 300 (FIG. 3) with 5-bit resolution. In these simulations, the input clock signals each have a fundamental frequency of 5 GHz with 90° phase separation.

Figure 5A:
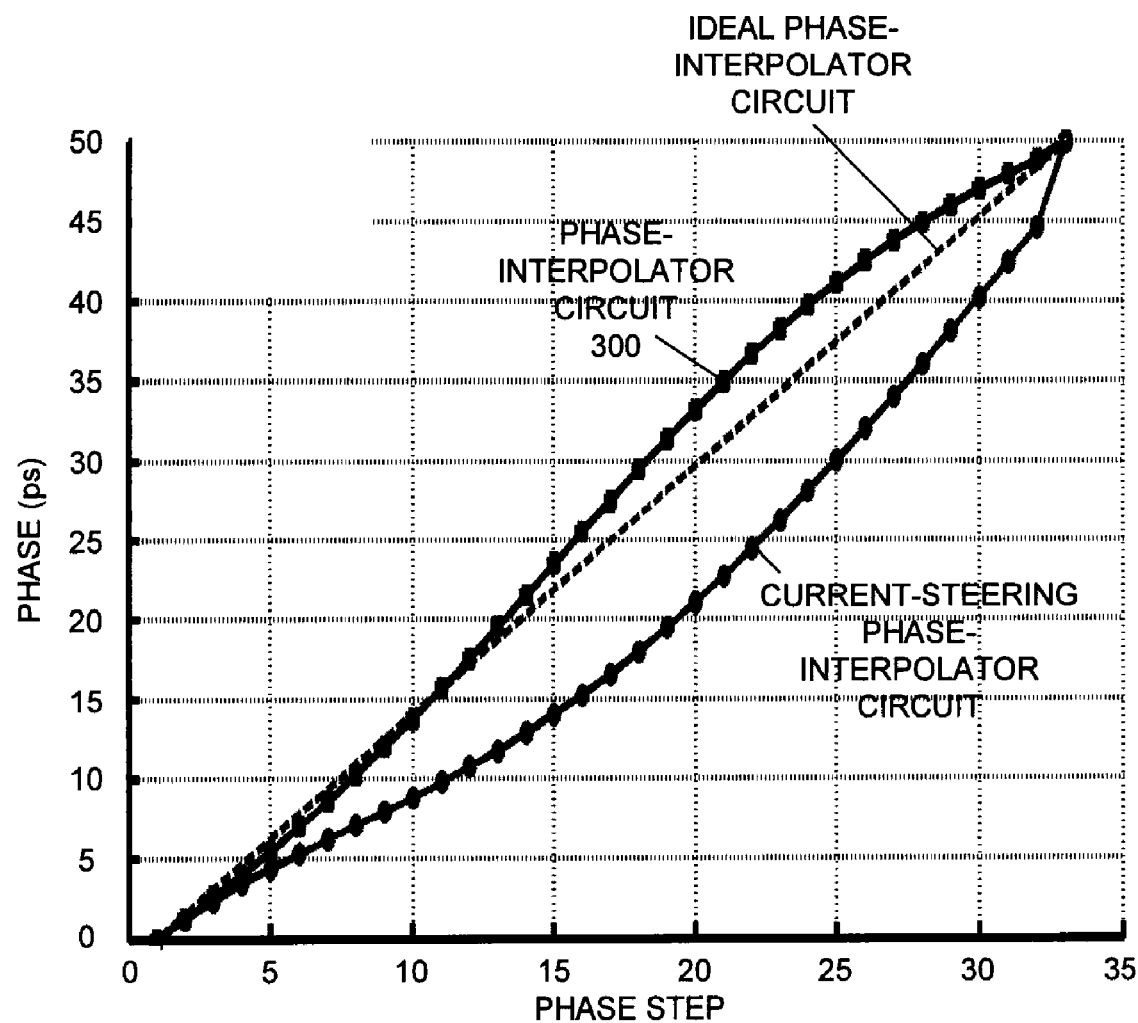
FIG. 5A is a graph of simulated phase steps in the phase-interpolator circuit of FIG. 3, an existing phase-interpolator circuit and an ideal phase-interpolator circuit in accordance with an embodiment of the present disclosure.
Figure 5B:
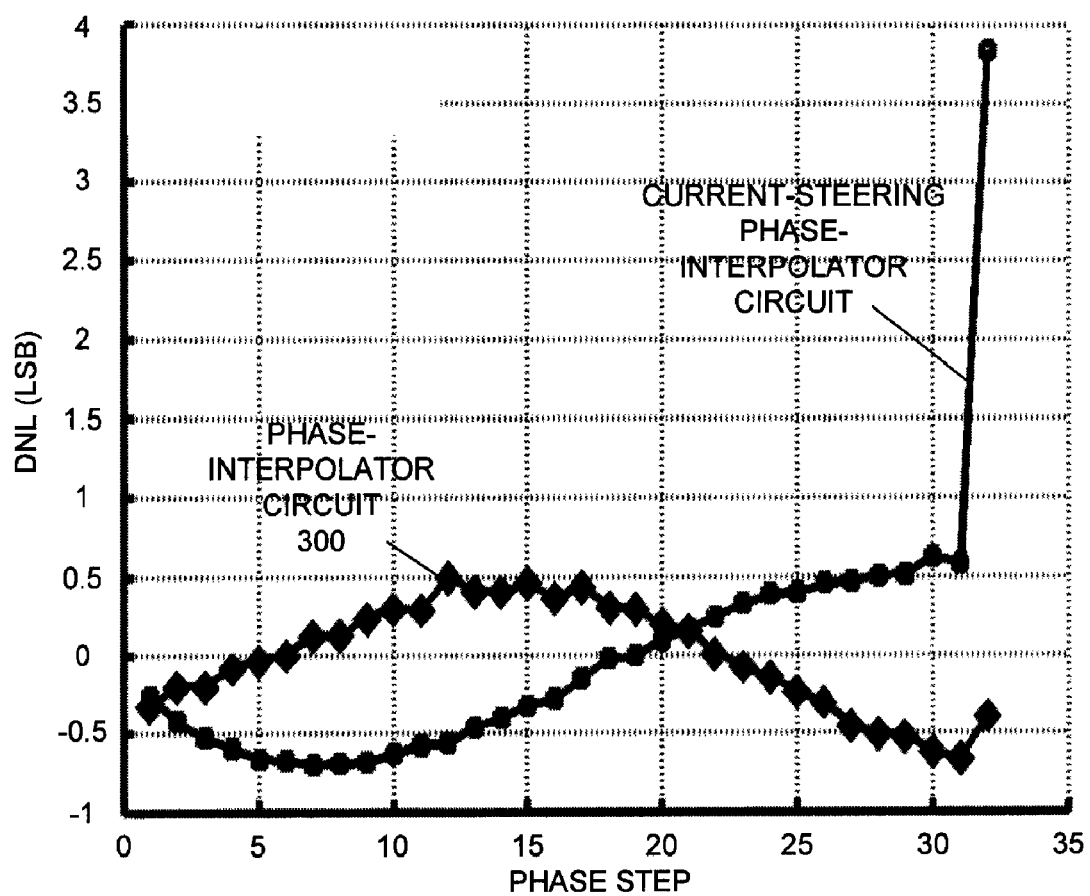
FIG. 5B is a graph of the simulated differential nonlinearity in the phase-interpolator circuit of FIG. 3 and an existing phase-interpolator circuit in accordance with an embodiment of the present disclosure.
Figure 5C:
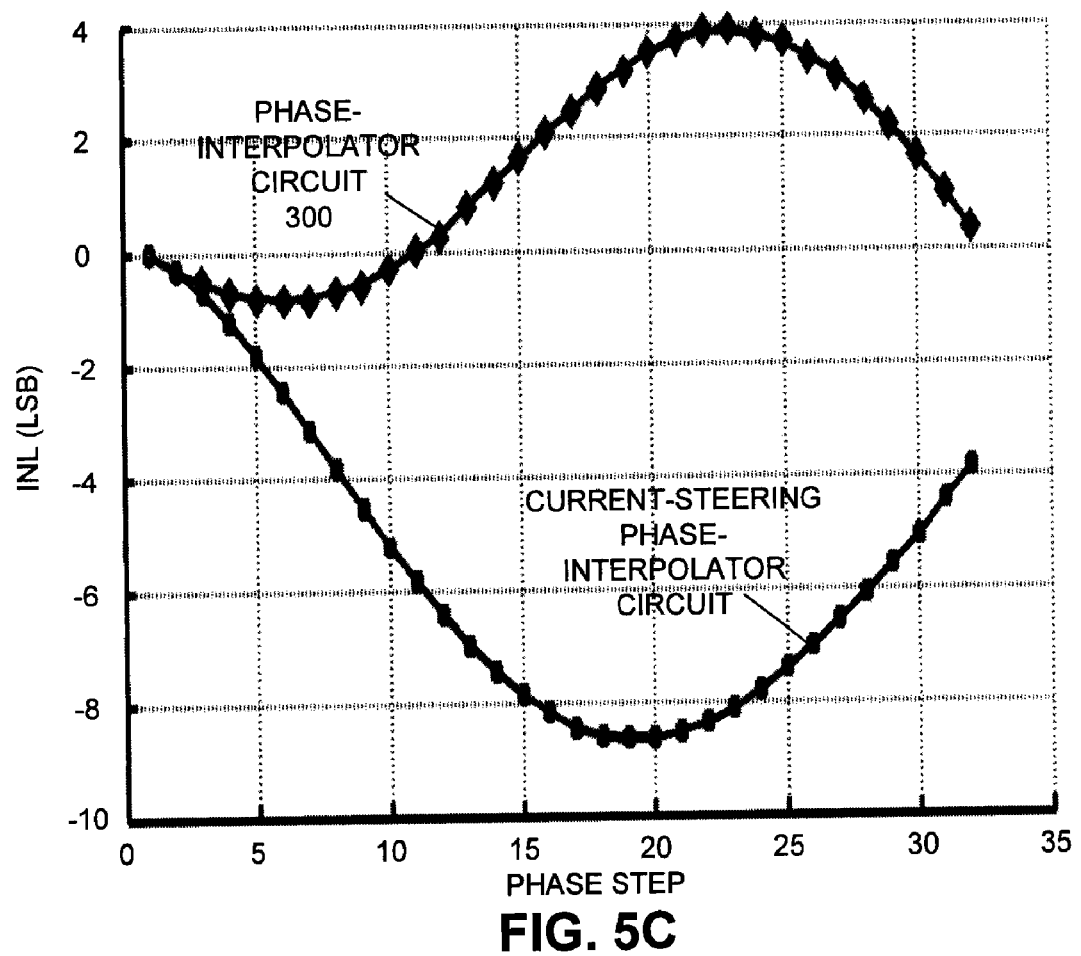
FIG. 5C is a graph of the simulated integrated nonlinearity in the phase-interpolator circuit of FIG. 3 and an existing phase-interpolator circuit in accordance with an embodiment of the present disclosure.

In order to put these results in perspective, the linearity of phase-interpolator circuit 300 (FIG. 3) is compared to an existing current-interpolator phase-interpolator circuit in FIGS. 5A-5C. In these simulations, both phase-interpolator circuits have the same resolution, and use the same input clock signals.

FIG. 5A presents a graph of simulated phase steps in phase-interpolator circuit 300 (FIG. 3), the existing current-steering phase-interpolator circuit and an ideal phase-interpolator circuit. Note that phase-interpolator circuit 300 (FIG. 3) has improved linearity relative to the existing current-steering phase-interpolator circuit. In addition, note the small deviations relative to the ideal phase interpolator. These deviations are mainly associated with the wide separation of the input clock phases. In particular, 90° is usually the widest allowed phase separation for any phase-interpolation input, and is known to produce nonlinearity. In addition, there may be small variations in the amplitude of the interpolated signal at the output of weighting circuit 212 in FIG. 2 (i.e., at central node 218 in FIG. 2) that result in small changes in the delay of amplifier 222 (FIG. 2), which affect the linearity. As described further below, this latter effect can be corrected by tweaking the sizes of capacitors 318 (FIG. 3).

FIG. 5B presents a graph of the simulated differential non-linearity (DNL) in phase-interpolator circuit 300 (FIG. 3) and the existing current-steering phase-interpolator circuit. Note that the maximum DNL of phase-interpolator circuit 300 (FIG. 3) is ±0.5 bits, and that the discontinuous jump in the DNL of the existing current-steering phase-interpolator circuit is due to capacitive feed-through. Furthermore, the DNL of phase-interpolator circuit 300 (FIG. 3) can be reduced significantly by inducing slight skew in the sizes of capacitors 318 (FIG. 3) so as to negate the DNL. This can be done without affecting the random mismatches of capacitor 318 in the capacitor bank. (In contrast, it is difficult to adopt this technique in existing current-steering phase-interpolator circuits because any induced skew in the transistor sizing typically requires the transistors to have separate wells and diffusion areas. This usually has a significant effect on the random mismatches in the current-source phase-interpolator circuits. Instead, the current sources typically need to have dimensions that satisfy the minimum required skew, which is difficult to achieve while trying to cancel the DNL.)

FIG. 5C presents a graph of the simulated integrated non-linearity (INL) in phase-interpolator circuit 300 (FIG. 3) and an existing current-steering phase-interpolator circuit. Note that the maximum INL of phase-interpolator circuit 300 (FIG. 3) is 4 bits versus −8.5 bits for the existing current-steering phase-interpolator circuit.

These simulation results are summarized in Table 1, which provides a comparison of the linearity of phase-interpolator circuit 300 (FIG. 3) and the existing current-steering phase-interpolator circuit.

TABLE 1

| Linearity Characteristic (Bits) | Phase-Interpolator Circuit 300 (FIG. 3) | Existing Current-Steering Phase-Interpolator Circuit |
| --- | --- | --- |
| DNL | ±0.5 | 4 |
| INL | 4 | −8.5 |

Figure 6:
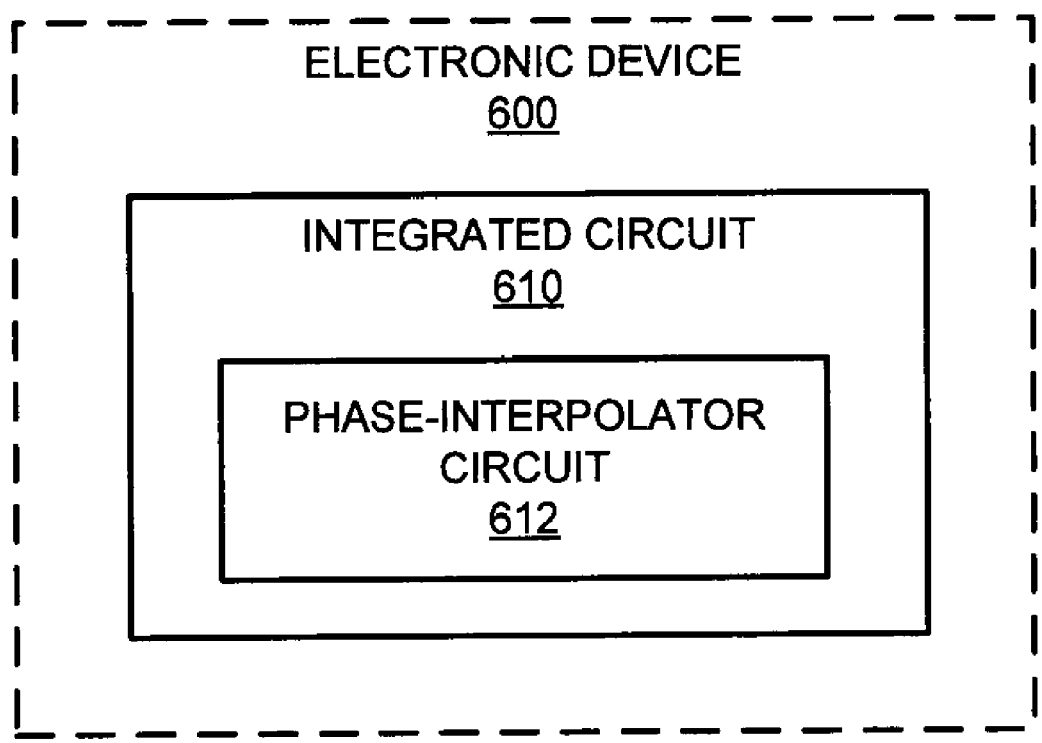
FIG. 6 is a block diagram of an electronic device that includes a phase-interpolator circuit in accordance with an embodiment of the present disclosure.

We now describe embodiments of an electronic device that includes one of the preceding embodiments of the phase-interpolator circuit, such as phase-interpolator circuit 300 (FIG. 3). FIG. 6 presents a block diagram of an electronic device 600 that includes phase-interpolator circuit 612 disposed on integrated circuit 610. This integrated circuit may include: a clock multiplier, a data-recovery circuit, a clock-recovery circuit (which captures the phase of incoming data), a clock generator, an RF circuit, a memory controller (including buffer-onboard application-specific integrated circuits or ASICs), a switching chip, a processor and/or communication circuit. For example, integrated circuit 610 may be included in a high-speed serial link operating at speeds up to 16 Gb per second per channel.

More generally, embodiments of the phase-interpolator circuit may be used in a variety of applications, including: VLSI circuits, communication systems, storage area networks, data centers, networks (such as local area networks), and/or computer systems (such as multiple-core processor computer systems). Note that electronic device 600 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

Phase-interpolator circuit 200 (FIG. 2), phase-interpolator circuit 300 (FIG. 3) and/or electronic device 600 may include fewer components or additional components. For example, in some embodiments capacitors 216 (FIG. 2) may be adjustable, active components.

Although phase-interpolator circuit 200 (FIG. 2), phase-interpolator circuit 300 (FIG. 3) and/or electronic device 600 are illustrated as having a number of discrete items, these circuits and devices are intended to be functional descriptions of the various features that may be present rather than structural schematics of the embodiments described herein. Consequently, in these embodiments two or more components may be combined into a single component, and/or a position of one or more components may be changed. Furthermore, note that circuits in these embodiments may be implemented using PMOS and/or NMOS, and signals may include digital signals that have approximately discrete values and/or analog signals that have continuous values. Thus, the control signals in FIG. 3 may be analog signals.

Figure 7:
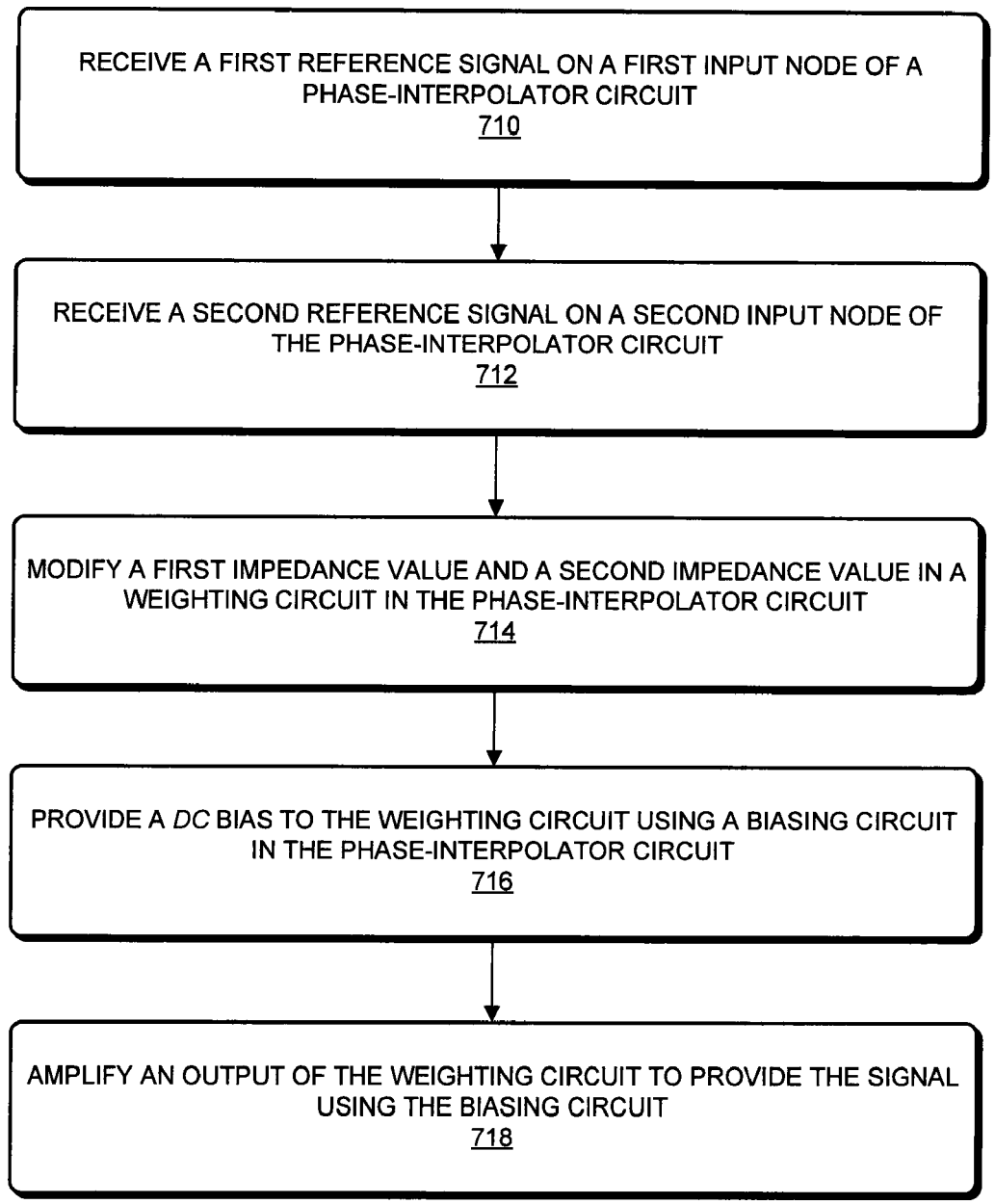
FIG. 7 is a flow chart illustrating a process for generating a signal having a fundamental frequency and a phase using a phase-interpolator circuit in accordance with an embodiment of the present disclosure.

We now describe embodiments of a process. FIG. 7 presents a flow chart illustrating a process 700 for generating a signal having a fundamental frequency and a phase using a phase-interpolator circuit, such as phase-interpolator circuit 300 (FIG. 3). During operation, the phase-interpolator circuit receives the first reference signal on the first input node (operation 710), and receives the second reference signal on the second input node (operation 712). Then, the phase-interpolator circuit modifies the first impedance value and the second impedance value in the weighting circuit (operation 714), thereby determining associated relative contributions of the first reference signal and the second reference signal to the output of the weighting circuit. Moreover, the biasing circuit provides the DC bias to the weighting circuit (operation 716). Next, the biasing circuit amplifies the output of the weighting circuit to provide the signal (operation 718).

In some embodiments, the first impedance value is a first capacitance associated with a first capacitor in the weighting circuit, and the second impedance value is a second capacitance associated with a second capacitor in the weighting circuit. Furthermore, modifying the first impedance value and the second impedance value may involve, respectively, adjusting the first capacitance and the second capacitance. Alternatively, modifying the first impedance value and the second impedance value may involve, respectively, selecting the first capacitance and the second capacitance.

In some embodiments of process 700, there are additional or fewer operations. Moreover, the order of the operations may be changed, and/or two or more operations may be combined into a single operation.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A phase-interpolator circuit, comprising:
a first input node configured to receive a first reference signal, wherein the first reference signal has a fundamental frequency and a first phase;
a second input node configured to receive a second reference signal, wherein the second reference signal has the same fundamental frequency and a second phase;
a weighting circuit with an output and inputs, electrically coupled to the first input node and the second input node, wherein the weighting circuit is configured to provide a contribution of the first reference signal to the output based on a first impedance value in the weighting circuit, and is configured to provide a contribution of the second reference signal to the output based on a second impedance value in the weighting circuit, wherein the weighting circuit comprises a capacitor that is selectively coupled to the first input node and to the second input node so that, at a given time, only one of the first reference signal and the second reference signal is coupled to the capacitor; and
a biasing circuit, electrically coupled to the weighting circuit, configured to provide a DC bias to the weighting circuit and configured to amplify the output of the weighting circuit to provide an output of the phase-interpolator circuit.

2. The phase-interpolator circuit of claim 1, wherein the weighting circuit includes a voltage divider that has a first arm electrically coupled to the first input node and a central node in the voltage divider, and that has a second arm electrically coupled to the second input node and the central node;
wherein the central node is electrically coupled to the biasing circuit; and
wherein the first arm includes a first component that has the first impedance value and the second arm includes a second component that has the second impedance value.

3. The phase-interpolator circuit of claim 2, wherein the first component includes a first capacitor and the first impedance value is a first capacitance of the first capacitor; and
wherein the second component includes a second capacitor and the second impedance value is a second capacitance of the second capacitor.

4. The phase-interpolator circuit of claim 3, wherein a given capacitance, which can be the first capacitance or the second capacitance, is selectable.

5. The phase-interpolator circuit of claim 3, wherein a given capacitor, which can be the first capacitor or the second capacitor, includes a switched capacitance network.

6. The phase-interpolator circuit of claim 5, wherein capacitances of one or more capacitors in the switched capacitor network include small differences relative to capacitances of other capacitors in the switch capacitor network that compensate for nonlinearities in the output of the phase-interpolator circuit.

7. The phase-interpolator circuit of claim 3, wherein a given capacitance, which can be the first capacitance or the second capacitance, is adjustable.

8. The phase-interpolator circuit of claim 3, wherein a series summation of the first capacitance and the second capacitance is approximately constant.

9. The phase-interpolator circuit of claim 1, wherein a series summation of the first impedance value and the second impedance value is approximately constant.

10. The phase-interpolator circuit of claim 1, wherein the output of the weighting circuit has approximately a constant amplitude for different relative contributions of the first reference signal and the second reference signal.

11. The phase-interpolator circuit of claim 1, wherein the phase-interpolator circuit is disposed on an integrated circuit.

12. The phase-interpolator circuit of claim 11, wherein the integrated circuit includes a processor.

13. The phase-interpolator circuit of claim 11, wherein the integrated circuit includes a communication circuit.

14. The phase-interpolator circuit of claim 11, wherein the integrated circuit includes a clock generator.

15. An electronic device, comprising an integrated circuit which includes a phase-interpolator circuit, wherein the phase-interpolator circuit includes:
a first input node configured to receive a first reference signal, wherein the first reference signal has a fundamental frequency and a first phase;
a second input node configured to receive a second reference signal, wherein the second reference signal has the same fundamental frequency and a second phase;
a weighting circuit with an output and inputs, electrically coupled to the first input node and the second input node, wherein the weighting circuit is configured to provide a contribution of the first reference signal to the output based on a first impedance value in the weighting circuit, and is configured to provide a contribution of the second reference signal to the output based on a second impedance value in the weighting circuit, wherein the weighting circuit comprises a capacitor that is selectively coupled to the first input node and to the second input node so that, at a given time, only one of the first reference signal and the second reference signal is coupled to the capacitor; and
a biasing circuit, electrically coupled to the weighting circuit, configured to provide a DC bias to the weighting circuit and configured to amplify the output of the weighting circuit to provide an output of the phase-interpolator circuit.

16. The electronic device of claim 15, wherein the weighting circuit includes a voltage divider that has a first arm electrically coupled to the first input node and a central node in the voltage divider, and that has a second arm electrically coupled to the second input node and the central node;
wherein the central node is electrically coupled to the biasing circuit; and
wherein the first arm includes a first component that has the first impedance value and the second arm includes a second component that has the second impedance value.

17. The electronic device of claim 16, wherein the first component includes a first capacitor and the first impedance value is a first capacitance of the first capacitor; and
wherein the second component includes a second capacitor and the second impedance value is a second capacitance of the second capacitor.

18. A method for generating a signal having a fundamental frequency and a phase using a phase-interpolator circuit, comprising:
receiving a first reference signal on a first input node of the phase-interpolator circuit, wherein the first reference signal has the fundamental frequency and a first phase;

receiving a second reference signal on a second input node of the phase-interpolator circuit, wherein the second reference signal has the same fundamental frequency and a second phase;

modifying a first impedance value and a second impedance value in a weighting circuit in the phase-interpolator, wherein the first impedance value determines a contribution of the first reference signal to an output of the weighting circuit, wherein the second impedance value determines a contribution of the second reference signal to the output of the weighting circuit and wherein the weighting circuit comprises a capacitor that is selectively coupled to the first input node and to the second input node so that, at a given time, only one of the first reference signal and the second reference signal is coupled to the capacitor;

providing a DC bias to the weighting circuit using a biasing circuit in the phase-interpolator circuit; and amplifying the output of the weighting circuit using the biasing circuit to provide the signal.

19. The method of claim 18, wherein the first impedance value is a first capacitance associated with a first capacitor in the weighting circuit and the second impedance value is a second capacitance associated with a second capacitor in the weighting circuit; and wherein modifying the first impedance value and the second impedance value involves, respectively, adjusting the first capacitance and the second capacitance.

20. The method of claim 18, wherein the first impedance value is a first capacitance associated with a first capacitor in the weighting circuit and the second impedance value is a second capacitance associated with a second capacitor in the weighting circuit; and wherein modifying the first impedance value and the second impedance value involves, respectively, selecting the first capacitance and the second capacitance.

* * * * *